(12) United States Patent
Honlein et al.

(10) Patent No.: US 6,809,361 B2
(45) Date of Patent: Oct. 26, 2004

(54) MAGNETIC MEMORY UNIT AND MAGNETIC MEMORY ARRAY

(75) Inventors: Wolfgang Honlein, Unterhaching (DE); Franz Kreupl, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/754,910

(22) Filed: Jan. 9, 2004

(65) Prior Publication Data

US 2004/0183110 A1 Sep. 23, 2004

Related U.S. Application Data

(63) Continuation of application No. PCT/DE02/02458, filed on Jul. 4, 2002.

(30) Foreign Application Priority Data

Jul. 10, 2001 (DE) .......................................... 101 33 373

(51) Int. Cl.$^7$ ............................................. H01L 31/062
(52) U.S. Cl. ................. 257/295; 257/421; 257/E27.006
(58) Field of Search ................................ 257/295, 421, 257/E27.006

(56) References Cited

U.S. PATENT DOCUMENTS

| | | | |
|---|---|---|---|
| 5,640,343 A | | 6/1997 | Gallagher et al. |
| 6,172,902 B1 | * | 1/2001 | Wegrowe et al. ........... 365/158 |
| 6,452,239 B1 | * | 9/2002 | McDowell et al. ......... 257/421 |

FOREIGN PATENT DOCUMENTS

EP          1 052 520 A1        11/2000

OTHER PUBLICATIONS

Harris, Peter, J.F.; "Carbon Nanotubes and Related Structures—New Materials for the Twenty–first Century"; Cambridge University Press, Cambridge (1999).

Dekker, C. et al; "Carbon Nanotubes as Molecular Quantum Wires"; Physics Today, May 1999, pp. 22–28.

Tsukagoshi, K. et al; "Coherent transport of electron spin in a ferromagnetically contacted carbon nanotube"; Nature, vol. 401, Oct. 7, 1999, pp. 572–574.

Reiss, G. et al;"Riesenmagnetowiderstand—Transfer in die Anwendung" (English—Giant magnetorersistance—transfer to application); Physikalische Blatter, Apr. 1998, pp. 339–341.

Prinz, Gary A.,"Magnetoelectronics applications"; Journal of Magnetism and Magnetic Materials 200, 1999, pp. 57–68.

Parkin, S.S.P. et al.;"Exchange–biased magnetic tunnel junctions and application to nonvolatile magnetic random access memory (invited)"; Journal of Applied Physics, vol. 85, No. 8, Apr. 15, 1999, pp. 5828–5833.

* cited by examiner

*Primary Examiner*—David Nelms
*Assistant Examiner*—Tu-Tu Ho
(74) *Attorney, Agent, or Firm*—Darby & Darby

(57) ABSTRACT

A magnetic memory unit having a first magnetizable electrode, a second magnetizable electrode, and at least one nanotube arranged between the electrodes in a longitudinal direction and coupled to the first electrode by a first longitudinal end and to the second electrode by a second longitudinal end. A storage information item is stored in the memory unit in a nonvolatile fashion by setting a magnetization direction of one of the magnetizable electrodes by applying an external magnetic field.

12 Claims, 3 Drawing Sheets

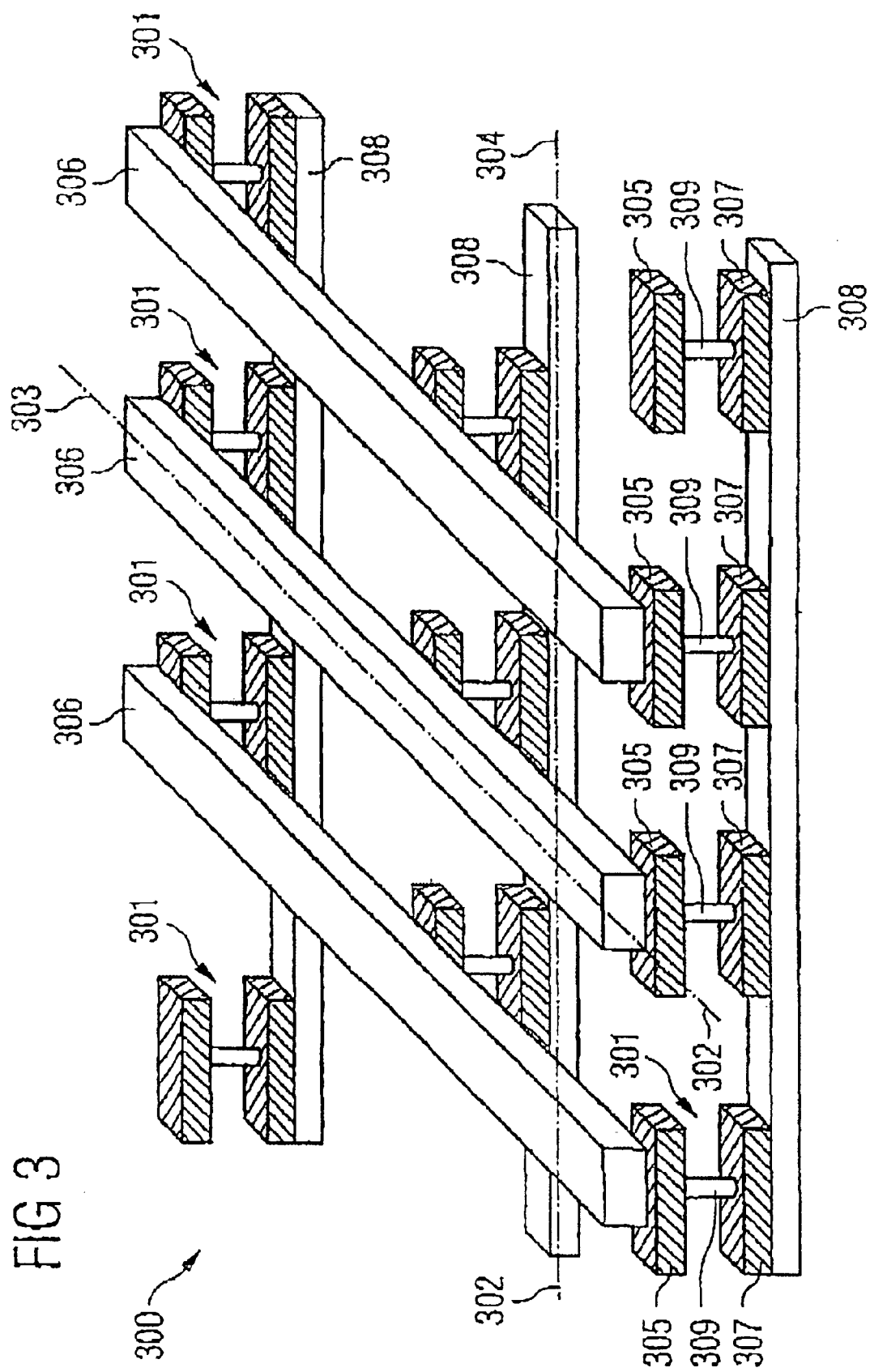

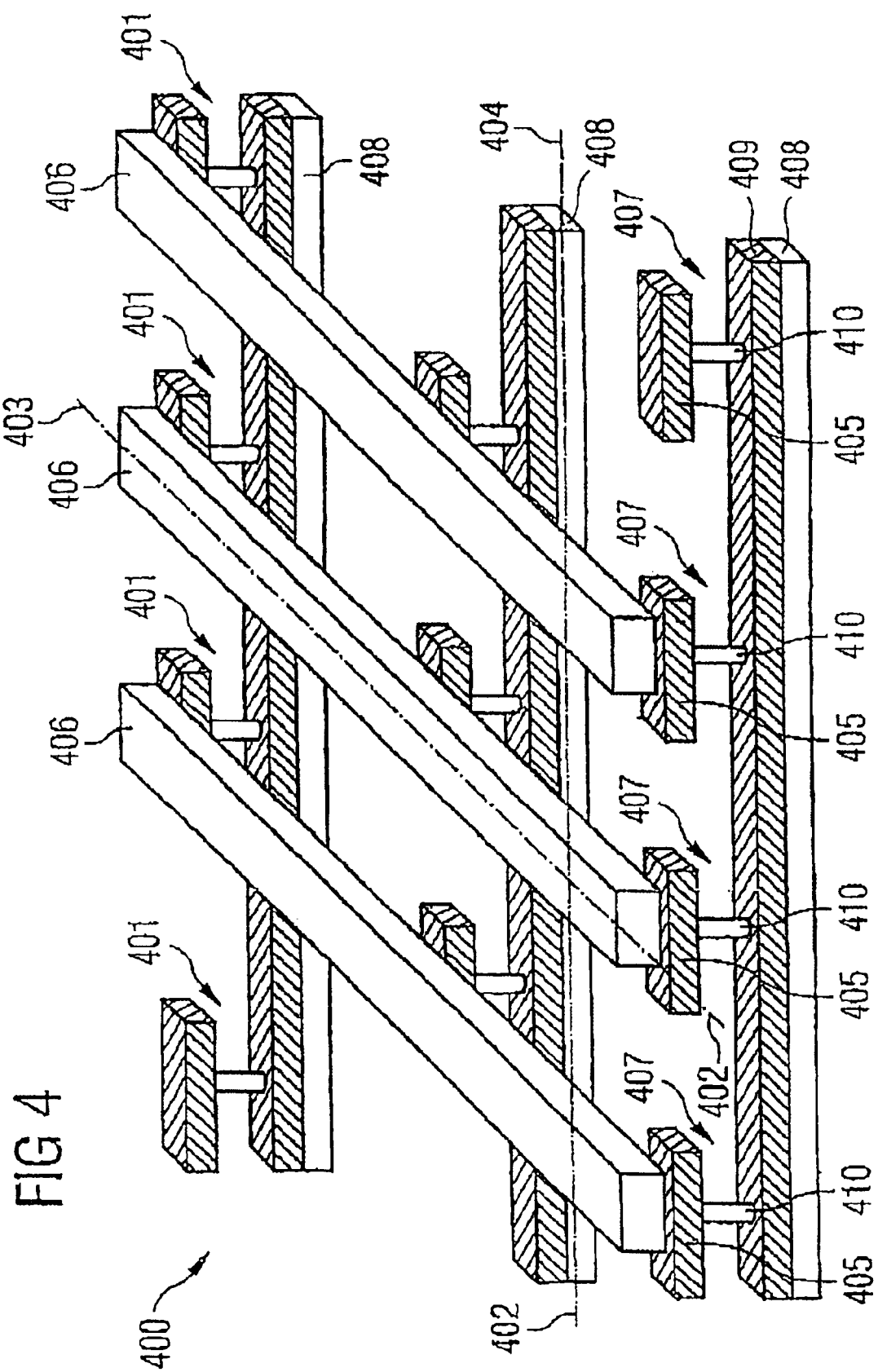

MAGNETIC MEMORY UNIT AND MAGNETIC MEMORY ARRAY

CROSS-REFERENCE TO RELATED APPLICATION

This application is a continuation of International Patent Application Serial No. PCT/DE02/02458, filed Jul. 4, 2002, which published in German on Jan. 23, 2003 as WO 03/007304 A2.

FIELD OF THE INVENTION

The invention relates to a magnetic memory unit and a magnetic memory array.

BACKGROUND OF THE INVENTION

The development in communications and information technology has led in recent years to continually rising requirements made of the capacity and the rapidity of memory modules. So-called nonvolatile mass storage devices such as, e.g., hard disks, magnetic tapes or optical storage devices are distinguished by a high storage capacity and by a low price per megabyte of storage capacity.

However, conventional silicon microelectronics will reach its limits as miniaturization advances further. In particular the development of increasingly smaller and more densely arranged nonvolatile memory elements, which are often based on transistors, will be subject to fundamental physical problems in the next ten years. If structural dimensions fall below 80 nm, the components are influenced by quantum effects in a disturbing manner, and they are dominated by quantum effects below dimensions of about 30 nm. The increasing integration density of the components on a chip also leads to a dramatic increase in the waste heat.

One known possible successor technology to follow conventional semiconductor electronics is carbon nanotubes. An overview of this technology is given for example in Harris, P. J. F (1999) "Carbon Nanotubes and Related Structures—New Materials for the Twenty-First Century", Cambridge University Press, Cambridge. A nanotube is a single-walled or multi-walled, tubular carbon compound. In the case of multi-walled nanotubes, at least one inner nanotube is surrounded coaxially by an outer nanotube. Single-walled nanotubes typically have diameters of approximately 1 nanometer; the length of a nanotube may amount to hundreds of nanometers. The ends of a nanotube are often terminated with in each case half a Fulleren molecule part.

The extended $\pi$ electron system and the geometrical structure of nanotubes bring about a good electrical conductivity, for which reason nanotubes are suitable for the construction of circuits with dimensions in the nanometer range. Dekker, C. et al. (1999) "Carbon Nanotubes as Molecular Quantum Wires", Physics Today 5/99: 22–28, discloses that the electrical conductivity of carbon nanotubes can significantly exceed that of metals of the same dimensioning. On account of the good electrical conductivity of nanotubes, the latter are suitable for a large number of applications, for example for electrical connection technology in integrated circuits, for components in microelectronics and also for electron emitters.

However, carbon nanotubes also have interesting properties with regard to magnetoelectronic applications which utilize the spin properties of electrical charge carriers. Tsukagoshi, K. et al. (1999) "Coherent transport of electron spin in a ferromagnetically contacted carbon nanotube" Nature 401: 572–574, discloses that carbon nanotubes transport the spin of conduction electrons over considerable dimensions without a spin flip-over process, if conduction electrons are injected into a carbon nanotube. If conduction electrons with polarized spins are injected into, a carbon nanotube for example proceeding from a ferromagnetic conductor, then the spin orientation of the conduction electron is maintained in the carbon nanotube over a path length of approximately 250 nm. This characteristic path length is referred to as spin coherence length. Moreover, in carbon nanotubes, there is comparatively little scattering of conduction electrons at phonons and lattice defects; the elastic scattering length is approximately 60 nm.

An interesting concept for fabricating miniaturized nonvolatile memories is so-called MRAMs (magnetic random access memory). The functioning of MRAMs is based on the giant magnetoresistance effect (XMR effect), the principles of which are described in Reiss, G. et al. (1998) "Riesenmagnetowiderstand—Transfer in die Anwendung" ["Giant magnetoresistance—transfer to application"] Physikalische Blätter 4/98: 339–341. XMR effects can be observed at structures in which two ferromagnetic layers are separated by a thin nonferromagnetic intermediate layer. If the magnetization directions of the two ferromagnetic layers are antiparallel with respect to one another, then majority spin carriers become minority spin carriers during spin-retaining passage from the first ferromagnetic layer across the intermediate layer through into the second ferromagnetic layer. The term majority charge carriers denotes conduction electrons with a spin orientation which corresponds to the ferromagnetic preferred direction. In other words, the spin preferred direction in the second ferromagnetic layer, which is adopted by the majority spin carriers of the second ferromagnetic layer, is antiparallel with respect to the spin preferred direction in the first ferromagnetic layer, which is adopted by the majority spin carriers of the first ferromagnetic layer. This results in a significantly increased electrical resistance given mutually antiparallel orientation of the two ferromagnetic layers compared with the case of a parallel magnetization of the two ferromagnetic layers. The reason for the dependence of the electrical resistance on the orientation of the magnetization vectors of the two layers with respect to one another is the spin-dependent tunnel effect. The electric current flow between the two layers is determined by the availability of free states in the conduction bands of the second layer. In the case of mutually parallel magnetization directions, the electron spins, which, in the first ferromagnetic layer, are for example preferably in a "spin up" state, find a high number of free states in the corresponding band for "spin up" electrons in the second ferromagnetic layer, so that a considerable tunneling current flows. In the case of antiparallel orientation with respect to one another, the energy bands are shifted relative to one another in such a way that at the Fermi edge there are not sufficiently many free states into which the electrons with "spin up" could tunnel. The tunneling current is low in this case and the layer arrangement is at high impedance. A parallel orientation of the magnetizations which is constrained by means of an external magnetic field, for example, therefore leads to the XMR effect, i.e. to a great reduction of the electrical resistance.

It must be emphasized that the intermediate region between the two ferromagnetic layers may also be a nonmagnetic layer, for example an electrically insulating tunnel barrier. The term "tunneling magnetoresistance" (TMR effect) is used in this case. MRAMs exploit the TMR effect; in other words, the quantum mechanical tunnel effect is combined with the giant magnetoresistance effect. MRAMs are distinguished by the nonvolatility of the stored information items and thus open up new market segments, precisely also in the case of portable products (digital photographic cameras, intelligent smart cards).

The functioning of an MRAM memory element is described below with reference to FIG. 1. The MRAM memory unit 100 shown in FIG. 1 has a soft-magnetic electrode 101, a hard-magnetic electrode 102 and a tunnel layer 103 arranged in between.

A hard-magnetic (or a magnetically hard) material is understood hereinafter to be a material in which the hysteresis curve, i.e. the relationship between the magnetization and the magnetic field strength, encloses a larger area than in the case of a soft-magnetic (or a magnetically soft) material, whose hysteresis curve encloses a smaller area. In general, both the remanence and the coercive force are greater in the case of a hard-magnetic material than in the case of soft-magnetic materials. In other words, reversing the magnetization of a soft-magnetic material requires a low work, whereas reversing the magnetization of a hard-magnetic material requires a high work. Since reversing the magnetization of the hard-magnetic electrode 102 requires a large work or a strong external magnetic field, in the case of the hard-magnetic electrode 102 a magnetization direction (shown as arrow 102a in FIG. 1), once it has been prescribed, is permanently preserved in the absence of extremely strong magnetic fields. Since it is already possible to reverse the magnetization of the soft-magnetic electrode 101 on account of a low work or on account of a low external field, the magnetization direction that is instantaneously present, depicted as solid arrow 101a in FIG. 1, can already be reversed into the opposite magnetization direction, depicted as dashed arrow 101b in FIG. 1, by means of a small external magnetic field.

In the scenario shown in FIG. 1, the magnetization directions of the soft-magnetic electrode 101 and of the hard-magnetic electrode 102 are oriented antiparallel with respect to one another. If, in accordance with this scenario, an electrical voltage is applied between the soft-magnetic electrode 101 and the hard-magnetic electrode 102 by means of the electrically conductive lead 104, then the current flow between the soft-magnetic electrode 101 and the hard-magnetic electrode 102 is low on account of the giant magnetoresistance effect. The magnetization directions of the soft-magnetic electrode 101 and of the hard-magnetic electrode 102 can be brought to correspondence by means of the application of such a magnetic field which is small enough to leave the magnetization direction of the hard-magnetic electrode 102 uninfluenced, but on the other hand is large enough to reverse the magnetization direction of the soft-magnetic electrode 101. On account of the giant magnetoresistance effect, in the case of a voltage applied to the electrically conductive leads 104, a large electric current would flow between the soft-magnetic electrode 101 and the hard-magnetic electrode 102. The flowing of a large electric current between the electrodes 101, 102 can be interpreted for example as a logic value "1", and the flowing of a small electric current between the electrodes 101, 102 can be interpreted as a logic value "0". Consequently, a data quantity of 1 bit can be stored in the MRAM memory unit 100.

However, the MRAM memory unit 100 shown in FIG. 1 has a series of disadvantages. Thus, the tunnel layer 103 is often formed as an aluminum oxide layer ($Al_2O_3$) having a thickness of about 1.5 nm. The homogeneous oxidation of an aluminum layer applied by sputtering is technologically difficult. Therefore, the fabrication of the tunnel layer 103 is difficult and costly. Furthermore, the thickness of the tunnel layer 103 must be chosen to be sufficiently small, so that a sufficiently high proportion of the conduction electrons can cross the tunnel layer 103 without a scattering process. In other words, the thickness of the tunnel layer 103 must be less than the average scattering length of the electrons in order to maintain the spin orientation during passage through the tunnel layer 103. In conventional MRAMs, the thickness of the tunnel layer 103 is usually between 0.5 nm and 3 nm. However, in order to write a bit to the MRAM memory unit 100, it is necessary to reverse the magnetization of the soft-magnetic electrode 101 without the hard-magnetic electrode 102 thereby likewise being subjected to magnetization reversal. Since the thickness of the tunnel layer 103 and thus the distance between the soft-magnetic electrode 101 and the hard-magnetic electrode 102 are upwardly limited by the need for a sufficiently large tunneling current, it is possible, in accordance with the MRAM memory unit 100 known from the prior art, that, when writing a bit to the soft-magnetic electrode 101, the hard-magnetic electrode 102 is adversely influenced, i.e. for example (partly) subjected to magnetization reversal, by the external magnetic field that is to be applied for this purpose. Furthermore, the magnetization of the soft-magnetic electrode 101 or the magnetization of the hard-magnetic electrode 102 in each case generates a magnetic field which decreases with increasing distance from the electrodes 101, 102. By virtue of the fact that the two electrodes 101, 102 are relatively closely adjacent for the purpose of ensuring a sufficiently high tunneling current whilst maintaining the spin orientation, a magnetic interaction between the magnetic fields generated by the soft-magnetic electrode 101 and the hard-magnetic electrode 102 is possible. Such an interaction is suitable for influencing the magnetization directions of the electrodes 101, 102. This is disadvantageous since there is therefore the risk of the loss of the data quantity of 1 bit which has been programmed into the MRAM memory unit 100. The effect described leads to a disadvantageous shortening of the retention time of the MRAM memory unit 100.

Moreover, the tunnel layer 103 has to have the smallest possible area in order to achieve a high integration density of MRAM memory units 100 in a memory array. The tunnel layer shown in FIG. 1 (an aluminum oxide layer having a thickness of about 1.5 nm) has an electrical resistance of approximately 1 $M\Omega nm^{-2}$ to approximately 40 $G\Omega nm^{-2}$ per cross-sectional area. If the one-dimensional extent of the MRAM memory unit 100 falls below an order of magnitude of approximately 100 nm, then a very high tunneling resistance results. However, a high tunneling resistance increases the RC time of the MRAM memory unit 100. The RC time of the memory unit 100 is a measure of the reading time of the MRAM memory unit 100, i.e., a measure of the time required to read out the data quantity stored in an MRAM memory unit 100. The high electrical resistance of the tunnel layer 103 thus leads either to a slow access time to the MRAM memory unit 100 or to a low integration density of memory units 100 on a memory array. This technological restriction is disadvantageous.

EP 1 052 520 A1 discloses a read head for reading out information stored in a magnetic storage medium, said read head having two ferromagnetic layers separated by a carbon nanotube. Said layers are set up in such a way that they have mutually parallel magnetization directions in the presence of a sufficiently strong external magnetic field, the magnetization directions flipping back into a mutually antiparallel orientation when the external magnetic field is switched off.

U.S. Pat. No. 5,640,343 discloses an MRAM having a tunnel barrier between two ferromagnetic layers, it being possible for the magnetization direction of one of the ferromagnetic layers to be set by means of an external magnetic field. Parkin, S. S. P., Roche, K. P., Samant, M. G., Rice, P. M., Beyers, R. B., Scheuerlein, R. E., O'Sullivan, E. J., Brown, S. L., Bucchignano, J., Abraham, D. W., Lu, Y., Rooks, M., Trouilloud, P. L., Wanner, R. A., Gallagher, W. J. (1999) "Exchange-biased magnetic tunnel junctions and application to nonvolatile magnetic random access memory" Journal of Applied Physics Vol. 85(8): 5828–5833, discloses materials which are suitable as a tunnel barrier of a nonvolatile magnetic memory cell.

SUMMARY OF THE INVENTION

The invention is based on the problem of providing a nonvolatile magnetic memory unit in which a shortened access time is combined with a high retention time and a high integration density.

The problem is solved by means of a magnetic memory unit and a magnetic memory array having the features in accordance with the independent patent claims.

The magnetic memory unit according to the invention has a first magnetizable electrode, a second magnetizable electrode and at least one nanotube, which is arranged between the electrodes in the longitudinal direction and which is coupled to the first electrode by its first longitudinal end and to the second electrode by its second longitudinal end.

The at least one nanotube is preferably a carbon nanotube. Preferably, in the magnetic memory unit of the invention, the two electrodes are arranged at a distance of 1 nm to 300 nm from one another.

The magnetic memory unit of the invention has a series of advantages. A major advantage over the known MRAM memory units is that the nanotube which produces the coupling between the first magnetizable electrode and the second magnetizable electrode has an increased length of 1 nm to 1,000 nm. MRAM memory units in accordance with the prior art have tunnel layers having thicknesses of typically 1.5 nm. By virtue of the fact that the length of the nanotubes of the magnetic memory unit according to the invention may have a magnitude of up to 1000 nm, the first magnetizable electrode and the second magnetizable electrode are spatially further away from one another than is customary in accordance with the prior art. In accordance with the above-described functionality of magnetic memory units, the first magnetizable electrode and the second magnetizable electrode in each case have a magnetization defined according to magnitude and direction, it being desirable for the magnetizations to influence one another as little as possible. Magnetic fields generated by magnetized layers decrease with increasing distance from the magnetic layer. Therefore, the magnetic field strengths of the first and of the second magnetizable electrode of the magnetic memory unit of the invention decrease with increasing distance from the electrodes.

By virtue of the fact that the first magnetizable electrode is sufficiently far away from the second magnetizable electrode on account of the large length of the nanotubes of up to 1000 nm, the interaction between the magnetic fields generated by the first magnetizable electrode and by the second magnetizable electrode is reduced according to the invention by comparison with the prior art.

As described above, in accordance with the prior art, the thickness of the tunnel layer between the magnetizable electrodes is upwardly limited on account of physical requirements that are to be made of the oxidic tunnel layer, in particular on account of the high electrical resistance of an oxidic tunnel layer, said resistance being directly proportional to the thickness thereof. Such a limitation is avoided, in principle, by using nanotubes instead of the tunnel layer as coupling unit between the magnetizable electrodes. The reason for this is that the average free path length between two scattering processes when conduction electrons pass through the carbon nanotube is significantly greater than in the case of an oxidic tunnel layer. In order not to lose the spin information of the conduction electrons between the magnetizable electrodes on account of scattering processes, the thickness of the coupling unit between the magnetizable electrodes is to be chosen to be small relative to the average free path length. The sufficiently high spatial distance between the magnetizable electrodes on account of the choice of carbon nanotubes as coupling unit between the magnetizable electrodes prevents the magnetizable electrodes from disadvantageously influencing one another. The magnetization directions of the magnetizable electrodes, in which the data quantity of 1 bit stored in the magnetic memory unit is coded, is thus maintained sufficiently reliably over a long period of time and is not restricted by a disadvantageous interaction between the magnetizable electrodes. The magnetic memory unit according to the invention therefore has a long retention time. The term retention time denotes that time over which the information to be stored in the magnetic memory unit is maintained.

Furthermore, it must be taken into consideration that the information that can be stored in the magnetic memory unit can be stored in the magnetic memory unit by means of the application of an external magnetic field to one of the magnetizable electrodes. In this case, it must be ensured that the external magnetic field only influences one, namely the desired, magnetizable electrode in such a way that the magnetization direction thereof can thereby be set. By contrast, the other of the magnetizable electrodes of a memory unit is intended to remain uninfluenced by the external magnetic field to be applied to the magnetic memory unit in order to store the data quantity of 1 bit. Such an external magnetic field decreases with increasing distance from the means for generating said external magnetic field (for example a conductor through which current flows), so that an undesired influencing of the other magnetizable electrode, which is not intended to be subjected to magnetization reversal by the external magnetic field, is avoided according to the invention. As a result, the magnetization information in one of the magnetizable electrodes can be stored sufficiently reliably in one of the magnetizable electrodes by means of a suitably chosen external field without having to fear a disadvantageous influencing of the other magnetizable electrode.

A further advantage of the magnetic memory unit according to the invention is to be seen in the small diameter of the nanotubes, which typically lies between 1 nm and 30 nm. As described above, MRAM memory units in accordance with the prior art have a technological limit with regard to the integration density of MRAM memory units in an MRAM memory array since, in the case of cross-sectional areas of less than 100 nm×100 nm, the tunnel barriers have very high tunneling resistances, which has a disadvantageous effect on the RC time and thus on the characteristic readout time of an MRAM memory unit. This technological limit with regard to the integration density of magnetic memory units in a magnetic memory array is significantly improved according to the invention. Nanotubes having a typical diameter of between 1 nm and 3 nm have, on account of the high electrical conductivity of nanotubes, a sufficiently low electrical resistance to keep the RC time and thus the read-out time of a magnetic memory unit sufficiently short. As a result, by means of the use of nanotubes as coupling element between the first magnetizable electrode and the second magnetizable electrode, the technological limit for the integration density of the magnetic memory units in a magnetic memory array is improved by a few orders of magnitude compared with the prior art. The fundamental technological limit prescribed by the nanotube is given in the cross-sectional area of the nanotube, which amounts to between 1 nm×1 nm and 30 nm×30 nm. As a result, the boundary conditions for providing magnetic memory elements having a high integration density are improved according to the invention.

Preferably, the at least one nanotube of the magnetic memory unit is set up in such a way that it constitutes a quantum mechanical tunnel contact, the spin state of charge carriers that flow between the two electrodes being at least partly preserved.

By virtue of the fact that, as described above, carbon nanotubes have a high spin coherence length of approximately 250 nm (see Tsukagoshi, K. et al.), a spin information item which has been impressed on the conduction electrons flowing through the nanotube for example in a ferromagnetic magnetizable electrode is preserved over dimensions of the order of magnitude of the spin coherence length during passage through a nanotube. In other words, conduction electrons pass through a carbon nanotube over dimensions of approximately 250 nm without spin flip-over processes (spin flips) taking place. Furthermore, the average free path length between two scattering processes is large for conduction electrons in carbon nanotubes. On account of this large average free path length between two successive scattering processes and on account of the high spin coherence length for polarized conduction electrons when passing through carbon nanotubes, carbon nanotubes are particularly well suited as coupling elements between a first magnetizable electrode and a second magnetizable electrode between which XMR effects are intended to occur. If, during the operation of the magnetic memory unit described above, a conduction electron with a spin orientation which is prescribed for this conduction electron by means of a magnetized electrode is coupled into a carbon nanotube, then this conduction electron transports this spin information over dimensions of 250 nm toward a second magnetizable electrode without spin flip-over processes taking place. In other words, the spin information is not lost when passing through a carbon nanotube. Relative to the magnetic memory unit described above, using a carbon nanotube thus also makes it possible for the information of 1 bit stored between two magnetizable electrodes to be read out without any errors. If the magnetization directions of the two electrodes are different, then the electrical resistance between these two magnetizable electrodes is large (XMR effect) and the current flow between the magnetizable electrodes given a fixedly applied electrical voltage is low. If the magnetization directions of the two magnetizable electrodes are the same, then the electrical resistance between the magnetizable electrodes is lower and the current flow between the two magnetizable electrodes given a fixedly applied voltage is greater than in the previously described case of two electrodes with mutually antiparallel magnetization directions. This significant dependence of the electrical resistance on the relative orientation of the magnetizations of the two electrodes with respect to one another would be corrupted, however, if the spin information of the conduction electrodes were altered when passing through the nanotube. This is avoided on account of the high spin coherence length, for which reason carbon nanotubes are particularly well suited as coupling element between a first magnetizable electrode and a second magnetizable electrode in a magnetic memory unit. As a result, the signal-to-noise ratio during the read-out of the data quantity stored in a magnetic memory unit is increased according to the invention.

Preferably, in the case of the magnetic memory unit, the first electrode has a first magnetic material, and the second electrode has a second magnetic material, the two materials having a different magnetic hardness and also being able to be formed as so-called multilayer layers. In this case, the two electrodes are in each case a magnetizable layer, which is in each case arranged perpendicular to the longitudinal axis of the nanotube.

As described above, a hard-magnetic material is understood to be a material having a high area under the hysteresis curve, so that it is only with difficulty that such a material can be subjected to magnetization reversal. By contrast, a soft-magnetic material has a hysteresis curve having a low enclosed area, so that such a material can be subjected to magnetization reversal by means of a small external magnetic field, the work for magnetization reversal being small in this case.

One of the magnetizable electrodes of the magnetic memory unit is produced from a soft-magnetic material. The magnetization direction of this electrode can be reversed by the application of a small external magnetic field, so that the information stored in the magnetic memory unit can be written or erased by means of the setting of the magnetization direction of the soft-magnetic electrode. By contrast, a specific magnetization direction is impressed in the hard-magnetic electrode of the magnetic memory unit once by means of a sufficiently strong external magnetic field and is then intended to remain permanently constant. As an alternative, magnetization may be effected by means of exchange interaction or by shape anisotropy.

Iron or an iron-nickel alloy is often used as soft-magnetic material for one of the magnetizable electrodes. Cobalt is often used as material for the hard-magnetic electrode. It is an advantage of the invention that the materials iron, nickel, cobalt suitable as first magnetic material and as second magnetic material with different magnetic hardnesses are materials which are particularly well suited to the growth of carbon nanotubes. Carbon nanotubes preferably grow on material which is catalytically active for the growth of carbon nanotubes, for example on iron, nickel or cobalt. Therefore, the materials which are suitable as material for the first magnetizable electrode and the second magnetizable electrode are also particularly well suited to the introduction of carbon nanotubes between electrodes produced from said materials. Therefore, the magnetic memory unit of the invention can be produced with tenable outlay and the carbon nanotubes that are to be introduced in between can be produced with a high quality.

As described above, MRAM memory units in accordance with the prior art are often slow on account of the high tunneling resistance of tunnel layers and the consequently high RC time constant. The characteristic time required for reading out the data quantity stored in an MRAM memory unit is given by the RC time of the MRAM memory unit. According to the invention, the electrical resistance of the memory unit is reduced by means of the use of a carbon nanotube as coupling element between the two magnetizable electrodes, therefore the RC time is reduced and, consequently, the rapidity of the memory elements is increased. On account of the very high conductivity of carbon nanotubes, the resistance of carbon nanotubes is of the order of magnitude of the Klitzing constant ($R_k$=25.8 k$\Omega$). The equivalent circuit of the magnetic memory unit has a capacitor having a capacitance C and a nonreactive resistor having a value R in which case the product of R and C can be interpreted as a measure of the read-out time of the data quantity stored in the magnetic memory unit. By virtue of the fact that, according to the invention, the electrical resistance of the coupling element between the first magnetizable electrodes and the second magnetizable electrode is significantly reduced compared with the electrical resistance of a tunnel layer in accordance with the prior art, the RC time is reduced according to the invention and a magnetic memory unit which can be operated with shortened read-out times is therefore provided.

Furthermore, the invention provides a magnetic memory array having a multiplicity of magnetic memory units, which magnetic memory units are described above.

The memory array according to the invention, which has memory units according to the invention, is described in more detail below. Refinements of the memory unit also apply to the memory array having memory units.

Preferably, the memory units are arranged at the crossover points of a two-dimensional grid determined by means of a first and a second grid axis. In the case of the magnetic memory array, in each case those first electrodes are coupled to a first interconnect, which first electrodes are arranged along a line parallel to the first grid axis. Furthermore, in each case those second electrodes are coupled to a second interconnect, which second electrodes are arranged along a line parallel to the second grid axis. In other words, a plurality of first interconnects arranged parallel to one another are set up in such a way that the interconnects run along a first grid axis of a two-dimensional grid. A second grid axis, along which a plurality of second interconnects arranged parallel to one another run, preferably runs perpendicular to the first grid axis. In plan view, the first interconnects and the second interconnects form a two-dimensional grid. However, preferably, the first interconnects are provided in a first plane and the second interconnects are provided in a second plane, which is arranged preferably parallel to and at a distance from the first plane. A magnetic memory unit, as is described above, is arranged in each crossover region between one of the first interconnects and one of the second interconnects. In this case, the first magnetizable electrode is coupled to one of the first interconnects and the second magnetizable electrode is coupled to one of the second interconnects, and the first magnetizable electrode is coupled to the second magnetizable electrode by means of at least one nanotube. The at least one nanotube preferably runs in a direction perpendicular to the first interconnects and perpendicular to the second interconnects.

A magnetic memory array by means of which a large data quantity can be stored with a high integration density together with short access times is provided in the manner described.

In the case of the magnetic memory array according to the invention, preferably, in each case those first electrodes are formed as a common integral electrode, which first electrodes are arranged along a line parallel to the first grid axis.

In accordance with this scenario, preferably, the first magnetizable electrodes of the magnetic memory unit are produced from the hard-magnetic material, whereas the second magnetizable electrodes are produced from the soft-magnetic material. The first magnetizable electrode of each memory unit, which electrode is produced from a hard-magnetic material, is preferably oriented once by a high magnetic field before the beginning of the storage of data in the magnetic memory units of the magnetic memory array of the invention and is then intended to remain as far as possible in the resulting magnetization orientation. In particular, it is necessary to avoid the situation in which the magnetization direction prescribed for the first magnetizable electrode is altered on account of a magnetic interaction between one of the first magnetizable electrodes and one of the second magnetizable electrodes.

By virtue of the fact that, in accordance with the refinement described, in each case those first electrodes are formed as a common integral electrode, which first electrodes are arranged along a line parallel to the first grid axis, the magnetization of the first electrodes made of the hard-magnetic material which are formed as common integral electrode is stabilized. As an alternative, the magnetization may be effected by means of shape anisotropy. Clearly, a significantly higher magnetic field force is necessary in order to reverse the magnetization of a common integral first electrode running continuously along a first interconnect with a continuous magnetization direction, since the number of atomic elementary magnets to be unmagnetized is proportional to the number of atoms in the first electrode. If the number of magnetic atoms is large as in the case of an electrode formed in integral fashion, then reversing the magnetization thereof requires a high magnetic field or a large work to be expended. A common integral first electrode has significantly more ordered atomic spins than a first electrode whose dimension is prescribed by the crossover region between one of the first interconnects and one of the second interconnects. It can clearly be understood that reversing the magnetization of this increased number of spins in the common integral first electrode requires higher magnetic fields and means that more magnetic energy has to be expended than in the case of the small number of spins which occur in the case of a first electrode whose dimension is limited to the crossover region between one of the first interconnects and one of the second interconnects. On account of the first electrodes arranged along an interconnect being formed in integral fashion, the hard-magnetic layer of the magnetic memory units is protected from an undesirable flip-over of the magnetization on account of magnetic fields which are applied for instance for the purpose of storage or read-out of the magnetization direction of the second electrodes of the memory units.

The storage of a magnetization direction in one of the second magnetizable electrodes of a magnetic memory unit of the magnetic memory array may be realized by suitable electric currents being fed in to that first interconnect and to that second interconnect at whose crossover region a magnetic memory unit to be programmed is arranged. These two conductors through which current flows then generate magnetic fields which reverse the magnetization of the second magnetizable electrode in that magnetic memory unit which is arranged in the crossover region of the first interconnect through which current flows and the second interconnect through which current flows. In accordance with the described refinement of the magnetic memory array, in which in each case those first electrodes are formed as a common integral electrode, which first electrodes are arranged along a line parallel to the first grid axis, the common integral electrode itself is the current carrier which provides the magnetic signal for reversing the magnetization of a second magnetizable electrode of a memory unit. As a result, the first electrodes made of the hard-magnetic material which is to be protected from magnetization reversal, said first electrodes being formed as a common integral electrode, are advantageously additionally protected from an undesirable flip-over of the magnetization direction.

As an alternative to the refinement of the magnetic memory array just described, it is possible, in the case of the magnetic memory array, for in each case those second electrodes to be formed as a common integral electrode, which second electrodes to be arranged along a line parallel to the second grid axis. In this case, the second electrodes are to be produced from the hard-magnetic material and the first electrodes are to be produced from the soft-magnetic material. The above argumentation can then be presented analogously, in which case, in accordance with the refinement now described, the first electrodes perform the function of the second electrodes in accordance with the previously described refinement, and vice versa.

BRIEF DESCRIPTION OF THE DRAWINGS

Exemplary embodiments of the invention are illustrated in the figures and are explained below.

FIG. 3 shows a view of a magnetic memory array in accordance with a first preferred exemplary embodiment of the invention, FIG. 4 shows a view of a magnetic memory array in accordance with a second preferred exemplary embodiment of the invention.

DETAILED DESCRIPTION OF THE PREFERRED MODE OF THE INVENTION

Figure 1:
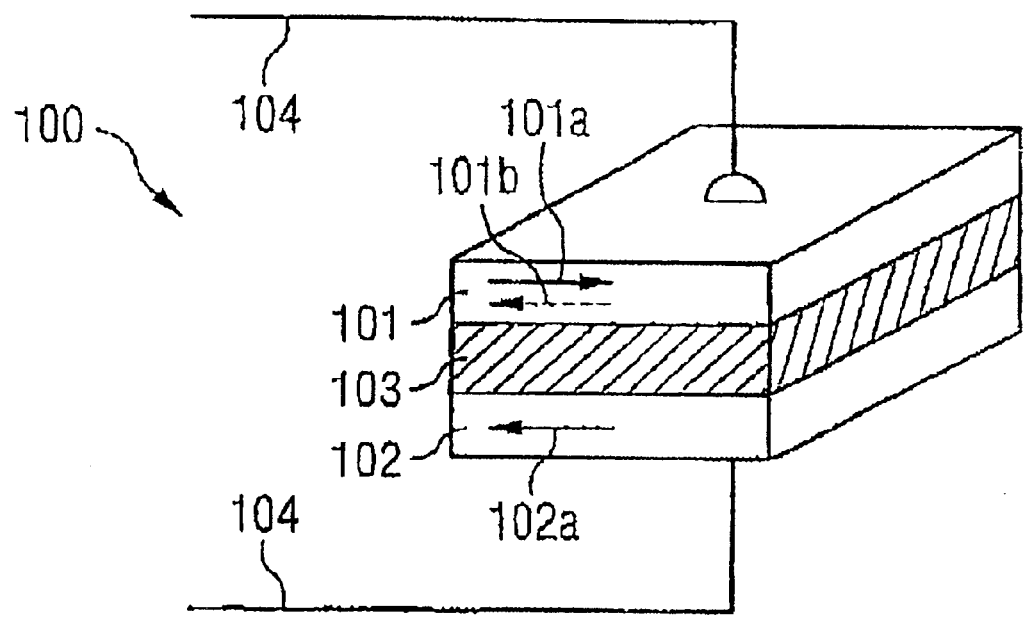
FIG. 1 shows a view of a magnetic memory unit in accordance with the prior art.

A preferred exemplary embodiment of the magnetic memory unit of the invention is described below with reference to FIG. 2. The magnetic memory unit 200 has a first magnetizable electrode 201, a second magnetizable electrode 202 and a nanotube 203, which is arranged between the electrodes 201, 202 in the longitudinal direction and which is coupled to the first electrode 201 by its first longitudinal end 203a and to the second electrode 202 by its second longitudinal end 203b. The nanotube 203 is a carbon nanotube.

The nanotube 203 is set up in such a way that it constitutes a quantum mechanical tunnel contact, the spin state of charge carriers which flow between the two electrodes 201, 202 being at least partly preserved during passage through the nanotube. The first electrode 201 has a first magnetic material and the second electrode 202 has as second magnetic material, the two materials having a different magnetic hardness. The first magnetizable electrode 201 is produced from a soft-magnetic material; in the case of the magnetic memory unit 200, the first magnetizable electrode 201 is produced from an iron-nickel alloy. The second magnetizable electrode 202 is produced from a hard-magnetic material, namely from cobalt material. The two electrodes 201, 202 are in each case a magnetizable layer, which are in each case arranged perpendicular to the longitudinal axis of the nanotube 203, as shown in FIG. 2.

Figure 2:
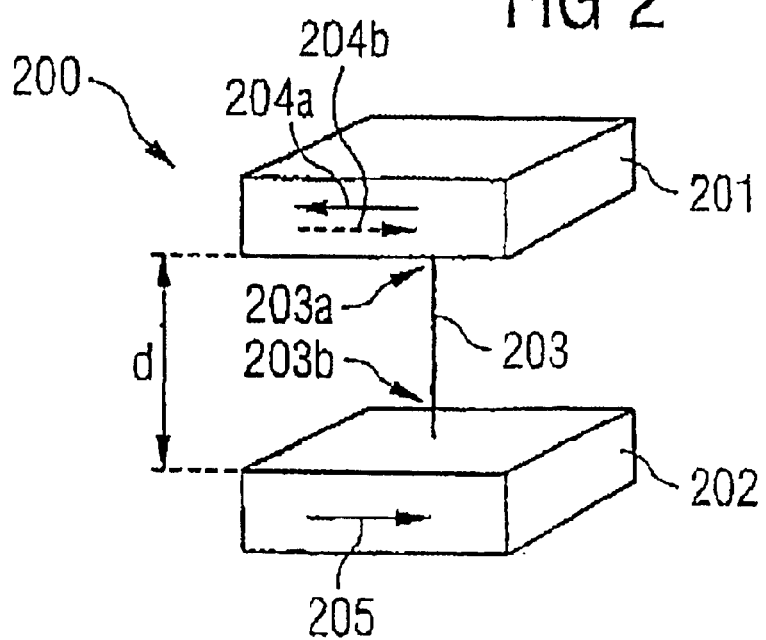
FIG. 2 shows a view of a magnetic memory unit in accordance with a preferred exemplary embodiment of the invention.

FIG. 2 furthermore shows that the two electrodes 201, 202 are arranged at a distance "d" from one another. The distance d corresponds to the length of the nanotube 203 and may amount for instance to between 1 nm and 300 nm. In accordance with the exemplary embodiment of the magnetic memory unit 200 as illustrated in FIG. 2, the length of the nanotube 203 is approximately 250 nm. This approximately corresponds to the spin coherence length of nanotubes, that is to say to that length of a nanotube over which a spin-polarized conduction electron can be transported without a spin flip-over process, so that the spin information of the conduction electron is preserved when passing through the nanotube 203.

FIG. 2 furthermore uses arrows to show the magnetization directions of the first magnetizable electrode 201 and of the second magnetizable electrode 202. The second magnetizable electrode 202, which is produced from the hard-magnetic material in accordance with the exemplary embodiment shown, has a magnetization direction 205, the magnetization direction 205 being identified by an arrow directed from left to right in FIG. 2. In accordance with the operating state of the magnetic memory unit 200 as shown in FIG. 2, the magnetization direction 204a of the first magnetizable electrode 201 is identified as an arrow with a solid line directed from right to left. In contrast to the second magnetizable electrode 202, which ideally remains permanently in the magnetization state 205 shown in FIG. 2, the magnetization direction of the first magnetizable electrode 201 can be subjected to magnetization reversal from the first magnetization direction 204a shown in FIG. 2 into a second magnetization direction 204b, which is opposite to the first magnetization direction 204a, by means of the application of a suitable external magnetic field. The fact that the first magnetizable electrode 201 can occur not only in the operating state with the magnetization direction 204a as shown in FIG. 2 but also in an operating state with a magnetization direction 204b opposite thereto, is identified in FIG. 2 by the fact that the second magnetization direction 204b directed from left to right is depicted with a dashed arrow.

It must be emphasized that the magnetization directions 204a, 204b of the first magnetizable electrode 201 and the magnetization direction 205 of the second magnetizable electrode 202, which run in the horizontal direction in accordance with the exemplary embodiment shown in FIG. 2, may also run in a vertical direction in accordance with FIG. 2 or in some other direction (not shown in the figures).

In the operating state of the magnetic memory unit 200 as shown with reference to FIG. 2, the magnetization directions of the first magnetizable electrode 201 and of the second magnetizable electrode 202 are opposite to one another, i.e. rotated through 180° relative to one another. In accordance with the giant magnetoresistance effect described above, the current flow takes place from the first magnetizable electrode 201 through the nanotube 203 to the second magnetizable electrode 202 with a high electrical resistance. In an operating state of the magnetic memory unit 200 that is not shown in the figures, in which the first magnetizable electrode 201 has the second magnetization direction 204b and the second magnetizable electrode 202 has the magnetization direction 205 unchanged, the electrical resistance for an electric current flowing between the first magnetizable electrode 201 and the second magnetizable electrode 202 is, by contrast, lower than in accordance with the scenario described previously.

In the magnetic memory unit 200 shown in FIG. 2, it is therefore possible to store a data quantity of 1 bit which is coded by means of the relative orientation of the magnetization directions 204a or 204b and 205 of the first magnetizable electrode 201 and of the second magnetizable electrode 202. If, in a magnetic memory unit 200, the first magnetizable electrode 201 has the first magnetization direction 204b and the second magnetizable electrode 202 has the magnetization direction 205, then the magnetization directions of the first and second electrodes 201, 202 are parallel to one another, the electrical resistance of the magnetic memory unit 200 is low and the current flow through the magnetic memory unit 200 given a fixed external electrical voltage is large. This may be interpreted for example as a logic value "0". By contrast, if the first magnetizable electrode 201 has the first magnetization direction 204a, then the magnetization directions of the first and second magnetizable electrodes 201, 202 are antiparallel with respect to one another, so that the electrical resistance of the magnetic memory unit 200 is high and the electric current flow through the magnetic memory unit 200 given a fixed external voltage is low. This may be interpreted for example as a logic value "1".

What is important for the functionality of the magnetic memory unit 200 is that the conduction electrons which are spin-polarized in the first magnetizable electrode 201 on account of the ferromagnetic character thereof are transported at least partly without any change in the spin state through the nanotube 203 right into the second magnetizable electrode 202. In other words, the spin preferred direction of the conduction electrons which are injected into the nanotube 203 must predominantly be maintained during passage through the nanotube. This makes it possible for the giant magnetoresistance effect to occur at the magnetic memory unit 200, and makes it possible to electrically detect the different electrical resistances in the two described operating states of the magnetic memory unit 200. This is realized according to the invention by the nanotube having a length "d" (see FIG. 2) where d is about 250 nm in accordance with the exemplary embodiment of the magnetic memory unit 200 as shown in FIG. 2. As a result, the length of the nanotube 203 is approximately equal to the spin coherence length of a nanotube. The nanotube 203 furthermore has a sufficiently low electrical resistance, so that the time constant with which the magnetic memory unit 200 can be operated is sufficiently low.

In this way, the invention provides a magnetic memory unit 200 in which the storage information coded therein can be accessed sufficiently rapidly. By virtue of the fact that the distance between the first magnetizable electrode 201 and the second magnetizable electrode 202 is sufficiently high on account of the nanotube 203 that is chosen to be sufficiently long, an undesirable interaction between the magnetic fields generated by the first magnetizable electrode 201 and the second magnetizable electrode 202 is avoided. The storage of the first magnetization direction 204a or alternatively of the second magnetization direction 204b in the first magnetizable electrode 201, which is generally realized by means of the application of an external magnetic field, only affects the first magnetizable electrode 201 on account of the sufficiently large distance d, whereas the second magnetizable electrode 202 is sufficiently well shielded from the external magnetic field for storing the magnetization direction in the first magnetizable electrode 201 on account of the high distance d. This exploits the physical effect that magnetic fields decrease with increasing distance from a magnetic material.

FIG. 3 shows a first preferred exemplary embodiment of the magnetic memory array 300 according to the invention having a multiplicity of magnetic memory units 301. Each of the magnetic memory units is constructed like the magnetic memory unit 200 described above with reference to FIG. 2.

In the case of the magnetic memory array 300, the memory units 301 are arranged at the crossover points of a two-dimensional grid 302 determined by means of a first grid axis 303 and a second grid axis 304. In the case of the magnetic memory array 300, in each case those first magnetizable electrodes 305 of a memory unit 301 are coupled to a first interconnect 306, which first magnetizable electrodes 305 are arranged along a line parallel to the first grid axis 303. Furthermore, in each case those second magnetizable electrodes 307 of the magnetic memory units 301 are coupled to a second interconnect 308, which second magnetizable electrodes 307 are arranged along a line parallel to the second grid axis 304.

A description is given below of how the magnetic memory array of the invention in accordance with the exemplary embodiment shown in FIG. 3 can be operated in principle.

Firstly, a description is given of how a data quantity of 1 bit can be programmed into a specific magnetic memory unit 301. For this purpose, an electric current is in each case applied to that first interconnect 306 and to that second interconnect 308 in whose crossover region the magnetic memory unit 301 to be addressed is arranged. In this case, the electric current intensity is to be chosen such that the essentially annular magnetic fields which are generated by the first interconnect 306 through which current flows and by the second interconnect 308 through which current flows are superposed only in the crossover region of the magnetic memory unit 301 to be selected in such a way that the resulting magnetic field strength at the location thereof suffices for flipping over the magnetization direction of the first magnetizable electrode 305 made of the soft-magnetic material that is arranged in said crossover region. The magnetic leakage fields at all of the other magnetic memory units 301 are not large enough to alter the magnetization direction of the first magnetizable electrodes 305 arranged in said crossover regions. As a result, it is only in the first magnetizable electrode 305 arranged in the crossover region between the first interconnect 306 through which current flows and the interconnect 308 through which current flows that the magnetization direction is rotated and a logic value "1" or "0" is thereby stored. Furthermore, although the magnetic field strength superposed in the crossover region of the first interconnect 306 through which current flows and the second interconnect 308 through which current flows is large enough to influence the magnetization direction of the first magnetizable electrode 305 which is produced from the soft-magnetic material and is arranged in the crossover region, the superposed magnetic field strength is not large enough to reverse the magnetization of the second magnetizable electrode 307 produced from the hard-magnetic material.

A description is given below of how the data quantity of 1 bit stored in each magnetic memory unit 301 can be read out. For this purpose, the voltage drop at a magnetic memory unit 301 is detected for example by a means (not shown in FIG. 3) for detecting an electrical voltage. Said voltage drop is large for a predetermined electric current intensity if the electrical resistance of the magnetic memory unit 301 is large, i.e. if the magnetization directions of the first magnetizable electrode 305 and of the second magnetizable electrode 307 of the magnetic memory unit 301 are oriented antiparallel with respect to one another (giant magnetoresistance effect). This scenario is assigned the logic value "1". The drop in the electrical voltage at the magnetic memory unit 301 is low, by contrast, if the electrical resistance of the magnetic memory unit 301 is low, i.e. if the magnetization directions of the first magnetizable electrode 305 and of the second magnetizable electrode 307 are parallel to one another. This scenario is assigned the logic value "0".

As an alternative to detecting the voltage drop at the magnetic memory unit 301, it is possible, by way of example, to detect the electric current flow through the magnetic memory unit 301 given a constant externally applied electrical voltage.

The functionality of the at least one nanotube 309 present in each memory unit 301 is crucial to the described detection of the electrical resistance of the memory unit 301. The dependence of the electrical resistance on the relative orientation of the magnetizations of the first magnetizable electrode 305 and of the second magnetizable electrode 307 with respect to one another is based on the fact that the spin preferred direction of conduction electrodes, which is impressed on the conduction electrodes by the magnetizable electrode 305, is preserved when passing through the nanotube 309, i.e. that at least a portion of the conduction electrodes passes through the nanotube 309 without a spin reversal process. This is realized by the coupling of the first magnetizable electrode 305 and the second magnetizable electrode 307 by means of a nanotube 309. Furthermore, the nanotubes 309 are at sufficiently low impedance to keep down the read-out time for a magnetic memory unit 301.

A second preferred exemplary embodiment of the magnetic memory array 400 according to the invention having a multiplicity of magnetic memory units 401 is described below with reference to FIG. 4.

In the case of the magnetic memory array 400, the magnetic memory units 401 are arranged at the crossover points of a two-dimensional grid 402 determined by means of a first grid axis 403 and a second grid axis 404. In the case of the magnetic memory array 400, in each case those magnetizable electrodes 405 are in each case coupled to a first interconnect 406, which first electrodes 405 are arranged along a line parallel to the first grid axis 403. Furthermore, in each case those second magnetizable electrodes 407 are in each case coupled to a second interconnect 408, which second magnetizable electrodes 407 are arranged along a line parallel to the second grid axis 404. In accordance with the magnetic memory array 400 shown in FIG. 4, in each case those second magnetizable electrodes 407 are formed as a common integral electrode 409, which second magnetizable electrodes 407 are arranged along a line parallel to the second grid axis 404. In the case of the magnetic memory units 401 in the crossover regions between the common integral electrodes 409 and the first interconnects 406; each common integral electrode 409 is coupled by means of carbon nanotubes 410 to the first magnetizable electrodes 405 arranged essentially above the common integral electrode 409.

The functionality of the magnetic memory array 400 with regard to the reading or storage of data quantities in the magnetic memory units 401 essentially corresponds to the functionality of the magnetic memory array 300 shown in FIG. 3. However, the formation of the second magnetizable electrodes 407 to give common integral electrodes 409 in the manner shown in FIG. 4 additionally stabilizes the magnetization direction of the second magnetizable electrodes 407, which, as explained above, are produced from the hardmagnetic material, whereas the first magnetizable electrodes 405 are produced from the soft-magnetizable material. Therefore, in accordance with the functionality of the magnetic memory array 400, the magnetization direction of the common integral electrodes 409 is intended to be permanently constant, even if data are stored in the magnetic memory units 401 or read out and, for this purpose, magnetic fields are applied to the magnetic memory array 400. By virtue of the fact that the second magnetizable electrodes 407 arranged along a second interconnect 408 are combined to form a common integral electrode 409, a continuous region 409 of an essentially uniform magnetization direction is present. A high physical work or a high external magnetic field is necessary in order to reverse the magnetization of this extensive integral common electrode 409. As an alternative, the magnetization may be effected by means of shape anisotropy. Therefore, on account of the formation of the second magnetizable electrodes 407 along a second interconnect 408 to give a common integral electrode 409, the magnetization of the common integral electrode 409 is stabilized and better protected from adverse influences for example on account of magnetic leakage fields. In accordance with the exemplary embodiment of the magnetic memory array 400 as shown in FIG. 4, the common integral electrode 409, during the storage of data in individual magnetic memory units 401, is itself the current carrier which generates the magnetic pulse for reversing the magnetization of a first magnetizable electrode 405. Therefore, during the storage of data in magnetic memory units 401, the common integral electrode 409 is itself protected from an undesirable magnetization reversal. The programming of data into the magnetic memory array 400 or the read-out of data from the magnetic memory array 400 is effected in the manner described above with reference to FIG. 3.

What is claimed is:

1. A magnetic memory unit, comprising:

a first magnetizable electrode;

a second magnetizable electrode; and at least one nanotube arranged between the electrodes in a longitudinal direction and coupled to the first electrode by a first longitudinal end and to the second electrode by a second longitudinal end;

wherein a storage information item is stored in the memory unit in a nonvolatile fashion by setting a magnetization direction of one of the magnetizable electrodes by applying an external magnetic field.

2. The magnetic memory unit as claimed in claim 1, wherein the nanotube is a carbon nanotube.

3. The magnetic memory unit as claimed in claim 1, wherein the nanotube constitutes a quantum mechanical tunnel contact, with the spin state of charge carriers that flow between the two electrodes being at least partly preserved.

4. The magnetic memory unit as claimed in claim 1, wherein the first electrode is of a first magnetic material and the second electrode is of a second magnetic material of a magnetic hardness different from the first magnetic material.

5. The magnetic memory unit as claimed in claim 1, wherein each of the two electrodes is a magnetizable layer arranged perpendicularly to the longitudinal axis of the nanotube.

6. The magnetic memory unit as claimed in claim 1, wherein the two electrodes are arranged at a distance of 1 nm to 300 nm from one another.

7. A magnetic memory array having a multiplicity of magnetic memory units as claimed in claim 1.

8. The magnetic memory array as claimed in claim 7, wherein the memory units are arranged at crossover points of a two-dimensional grid determined by a first and a second grid axis.

9. The magnetic memory array as claimed in claim 8, wherein each of the first electrodes is coupled to a first interconnect, and the first electrodes are arranged along a line parallel to the first grid axis.

10. The magnetic memory array as claimed in claim 8, wherein each of the second electrodes is coupled to a second interconnect, and the second electrodes are arranged along a line parallel to the second grid axis.

11. The magnetic memory array as claimed in claim 8, wherein each of the first electrodes is formed as a common integral electrode, and the first electrodes are arranged along a line parallel to the first grid axis.

12. The magnetic memory array as claimed in claim 8, wherein each of the second electrodes is formed as a common integral electrode, and the second electrodes are arranged along a line parallel to the second grid axis.

* * * * *